United States Patent

Nagano

[11] Patent Number: 5,861,679
[45] Date of Patent: Jan. 19, 1999

[54] PATTERN AND METHOD FOR MEASURING ALIGNMENT ERROR

[75] Inventor: Takashi Nagano, Kanagawa, Japan

[73] Assignee: Sony Corporation, Tokyo, Japan

[21] Appl. No.: 899,863

[22] Filed: Jul. 24, 1997

[30] Foreign Application Priority Data

Jul. 26, 1996 [JP] Japan .................................. 8-215473

[51] Int. Cl.[6] .................................................. H01L 23/544
[52] U.S. Cl. ......................... 257/786; 257/797; 257/207; 257/211
[58] Field of Search ..................................... 257/797, 773, 257/774, 786, 207, 211, 909, 48; 438/975

[56] References Cited

U.S. PATENT DOCUMENTS 5,384,488  1/1995  Golshan et al. ........................ 257/786
5,625,224  4/1997  Greenwood et al. .................... 257/786

*Primary Examiner*—Valencia Martin-Wallace
*Assistant Examiner*—David B. Hardy
*Attorney, Agent, or Firm*—Hill & Simpson

[57] ABSTRACT

An alignment error measurement pattern includes a plurality of wiring patterns and a plurality of opening patterns formed in an insulating film covering the wiring patterns. The edges of the wiring patterns and the opening patterns correspond to each other to constitute sets, and distances between them are all different from one set to another. Corresponding wiring pattern and opening pattern in the same set are or are not in contact with each other depending on the alignment error between them. Therefore, the alignment error between the wiring pattern and the opening pattern can be electrically measured by checking the conduction state between them. Hence, an alignment error of a semiconductor device can be measured at high precision, and easily even after the manufacture.

11 Claims, 7 Drawing Sheets

PATTERN AND METHOD FOR MEASURING ALIGNMENT ERROR

BACKGROUND OF THE INVENTION

1. Field of the Invention

The present invention relates to a pattern and method for measuring an alignment error in the lithography process employed in the manufacture of a semiconductor device.

2. Description of the Related Art

As the integration degree of a semiconductor device increases, the minimum design rule decreases, and the resolution of the lithography technique increases accordingly. Along with an increase in resolution, the alignment precision between a pattern preformed on a wafer and a projection image projected through an exposure mask used in the lithography process also increases. High precision is therefore required in measurement of an alignment error.

Regarding a method of measuring an alignment error, a method of comparing a lower pattern for alignment error measurement and an upper pattern with an optical microscope, a method of forming an opening as an upper pattern in an insulating film, and observing a lower pattern under the insulating film through the opening, thereby comparing the lower and upper patterns, and the like are conventionally proposed.

With the method of comparing the lower pattern for alignment error measurement and the upper pattern with the optical microscope, sufficiently high precision cannot be obtained due to the limitation in resolution of the optical microscope. An alignment error in a semiconductor device of the half micron or submicron generation cannot therefore be measured at high precision.

A scanning electron microscope has a higher resolution than that of an optical microscope and is used in the lithography process to measure the width of patterned line or the diameter of opening. However, the scanning electron microscope allows to observe an image formed by secondary electrons generated from the surface of an observation target. When the lower pattern is covered with an interlayer insulating film or the like, this lower pattern cannot be observed. Therefore, it is difficult to measure an alignment error by using the scanning electron microscope.

With the method of forming an opening as an upper pattern in the insulating film and observing the lower pattern under the insulating film through the opening, thereby comparing the lower and upper patterns, when an interlayer insulating film or the like is formed on the opening, it is also difficult to measure an alignment error by using a scanning electron microscope.

With any conventional methods, an alignment error cannot be electrically measured. Therefore, an alignment error in a semiconductor device cannot be easily measured after the manufacture.

OBJECT AND SUMMARY OF THE INVENTION

It is, therefore, an object of the present invention to provide an alignment error measuring pattern and an alignment error measuring method capable of measuring an alignment error in a semiconductor device at high precision and easily even after the manufacture.

An alignment error measurement pattern according to the present invention is characterized by comprising a plurality of wiring patterns formed on a substrate, an insulating film covering the wiring patterns, and a plurality of opening patterns formed in the insulating film, wherein edges of the wiring patterns and the opening patterns correspond to each other to constitute sets, and distances between the edges of the wiring patterns and the opening patterns in the sets are all different from one set to another.

In this measurement pattern, corresponding wiring pattern and opening pattern in the same set are or are not in contact with each other depending on the alignment error between them. Therefore, the alignment error between the wiring pattern and the opening pattern can be electrically measured by checking the conduction state between them. Hence, an alignment error of a semiconductor device can be measured at high precision, and easily even after the manufacture.

In the alignment error measurement pattern according to the present invention, it is preferable that the wiring patterns are formed to be parallel to each other. In this measurement pattern, the number of sets in which the wiring patterns and the opening patterns are in contact with each other changes depending on the alignment error between the wiring patterns and the opening patterns in the extending direction of the wiring patterns. Hence, the alignment error can be measured easily by checking the conduction state between the wiring patterns and the opening patterns of a plurality of sets.

In the alignment error measurement pattern according to the present invention, it is preferable that the wiring patterns are formed to be parallel to each other and in two lines such that the edges thereof oppose each other, and the opening patterns be formed in a line along a direction of lines of the wiring patterns. In this measurement pattern, even if the widths of wiring lines and the diameters of openings deviate from the designed values, if their intermediate values are employed, an actual alignment error between the wiring lines and the openings can be measured. Therefore, an alignment error can be measured at higher precision.

In the alignment error measurement pattern according to the present invention, it is preferable that distances between the edges of the wiring patterns and the opening patterns sequentially differ in the same direction. In this measurement pattern, the number of sets in which the wiring patterns and the opening patterns are in contact with each other changes depending on the alignment error between the wiring patterns and the opening patterns in the same direction described above. Hence, the alignment error can be measured easily by checking the conduction state between the wiring patterns and opening patterns of a plurality of sets.

In the alignment error measurement pattern according to the present invention, it is preferable that the wiring patterns respectively comprise low-resistance portions having the edges and relatively low electric resistances, and high-resistance portions communicating with the low-resistance portions, having relatively high electric resistances, and determining electric resistances of wiring lines. In this measurement pattern, even if a low-resistance portion and an opening pattern come into contact with each other to cause a contact resistance between the measurement terminals in the opening pattern and the low-resistance portion, the electric resistances of the respective wiring patterns do not substantially deviate depending on the contact resistance. For this reason, the number of sets in which the wiring patterns and the opening patterns are in contact with each other can be obtained accurately, so that alignment error can be measured at higher precision.

In the alignment error measurement pattern according to the present invention, it is preferable that a plurality of openings are formed for each of the plurality of wiring patterns. In this measurement pattern, when compared to a structure having a single opening for each wiring pattern, since the contact resistance between the measurement terminals in the opening and the low-resistance portion is low, deviations in electric resistances of the respective wiring patterns caused by the contact resistance are further decreased. Hence, the number of sets in which the wiring patterns and the opening patterns are in contact with each other can be obtained accurately, so that an alignment error can be measured at higher precision.

The alignment error measurement pattern according to the present invention preferably has the wiring patterns in which, even when the maximum alignment error occurs, the opening patterns come into contact with the low-resistance portions. In this measurement pattern, since the wiring patterns and the opening patterns described above are always in contact with each other, the electric resistances of the high-resistance portions, i.e., the electric resistances of the wiring patterns, can be obtained by supplying a current to these wiring patterns. For this reason, the number of sets in which the wiring patterns and the opening patterns are in contact with each other can be obtained easily, so that an alignment error can be measured easily.

In the alignment error measurement pattern according to the present invention, it is preferable that electric resistances of the plurality of wiring patterns are equal to each other. In this measurement pattern, the number of sets in which the wiring patterns and the opening patterns are in contact with each other can be obtained accurately, so that an alignment error can be measured at higher precision.

In the alignment error measurement pattern according to the present invention, it is preferable that the wiring lines are connected to each other by connecting edges thereof that are opposite to the edges near the opening patterns to be electrically parallel with each other, and a wiring layer be formed on the insulating film to cover all the plurality of opening patterns. In this measurement pattern, since the number of measurement terminals is small, the conduction state between the wiring patterns and opening patterns of a plurality of sets can be checked easily, so that an alignment error can be measured easily.

In the alignment error measurement pattern according to the present invention, it is preferable that corresponding wiring patterns and opening patterns constituting pairs in the plurality of sets are arranged to be axi-symmetric to each other in the same direction. In this measurement pattern, even if the widths of wiring patterns and the diameters of opening patterns deviate from the designed values, if their intermediate values are employed, an actual alignment error between the wiring patterns and the opening patterns can be measured. Thus, an alignment error can be measured at higher precision.

In the alignment error measurement pattern according to the present invention, it is preferable that the distances between the wiring patterns and opening patterns in the respective sets differ from one set to another by ⅕ the minimum line width. In this measurement pattern, since an alignment error can be measured with the precision of ⅕ the minimum line width, it can be measured at appropriate precision that does not hinder the operation of the semiconductor device.

An alignment error measuring method according to the present invention is characterized by comprising the steps of forming a plurality of wiring patterns, forming an insulating film on the plurality of wiring patterns, forming, in the insulating film, opening patterns corresponding to the wiring patterns to respectively constitute sets therewith and having different distances from edges of the wiring patterns, checking electrical conduction states between the wiring patterns and the opening patterns, and measuring alignment errors between the wiring patterns and the opening patterns from the electrical conduction states.

With this alignment error measurement method, corresponding wiring pattern and opening pattern in the same set are or are not in contact with each other depending on the alignment error between them. Therefore, the alignment error between the wiring pattern and the opening pattern can be electrically measured by checking the conduction state between them. Hence, an alignment error of a semiconductor device can be measured at high precision, and easily even after the manufacture.

DETAILED DESCRIPTION OF THE PREFERRED EMBODIMENTS

Figure 1:
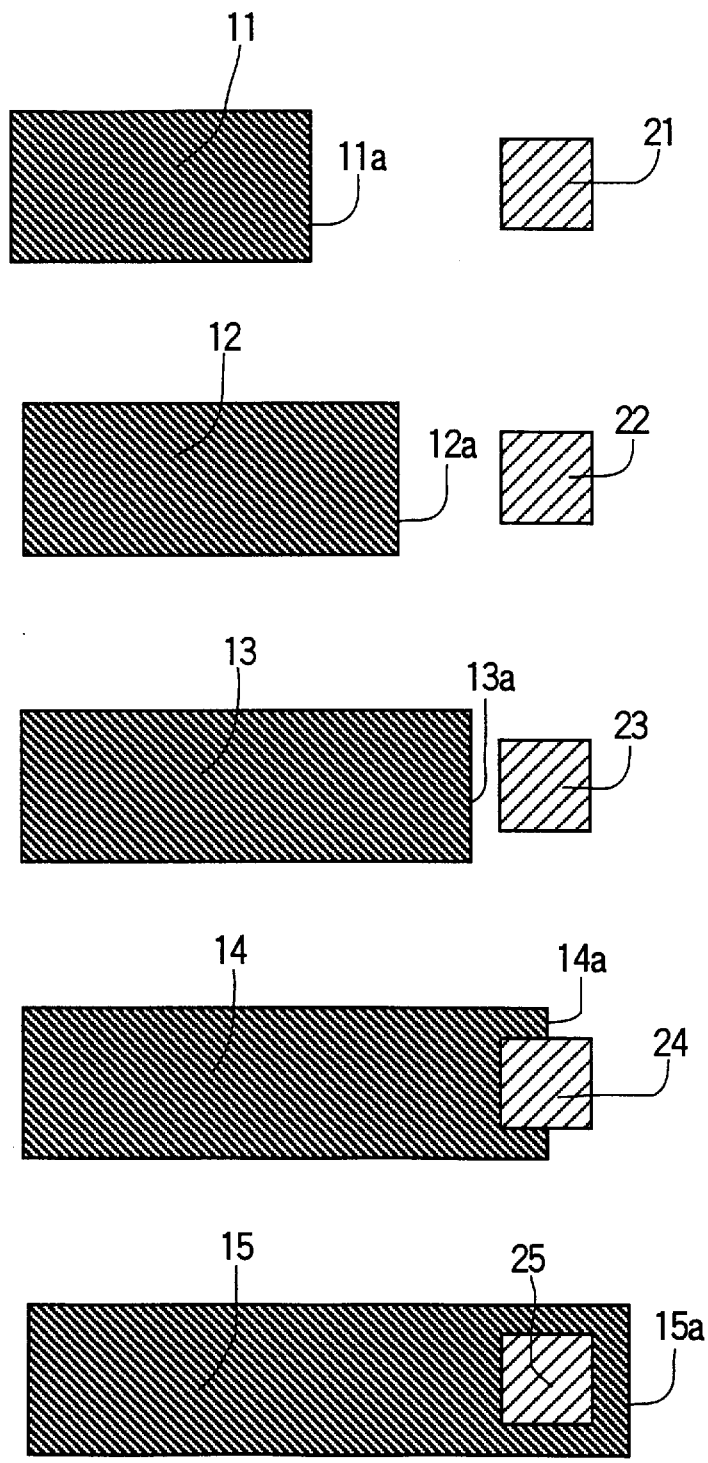
FIG. 1 is a plan view of an alignment error measurement pattern according to the first embodiment of the present invention, in which an alignment error does not occur.
Figure 2:
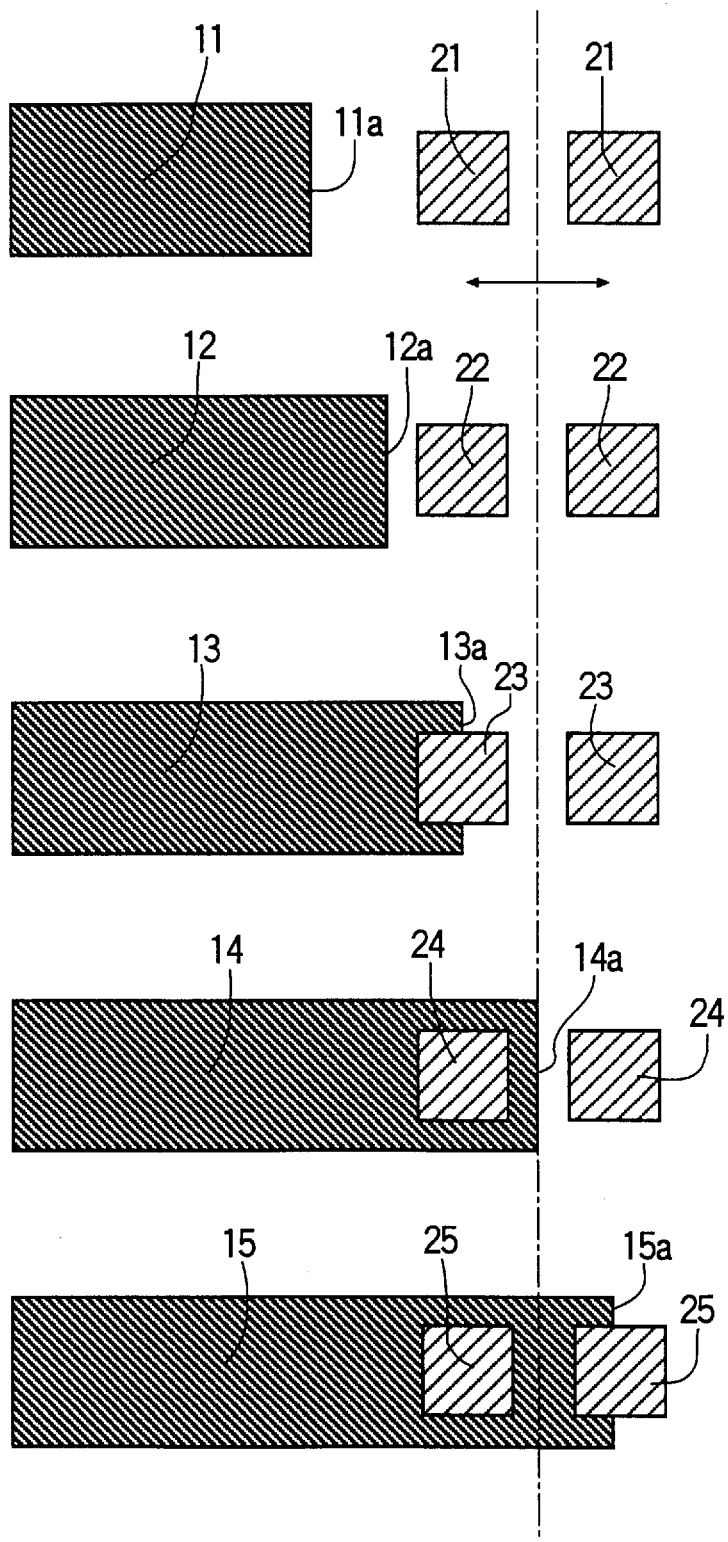
FIG. 2 is a plan view of an alignment error measurement pattern according to the first embodiment of the present invention, in which an alignment error has occurred.

The first to fifth embodiments of the present invention will be described with reference to FIGS. 1 to 7. FIGS. 1 and 2 show the first embodiment. The first embodiment has an alignment error measurement pattern including five wiring lines 11 to 15 and five openings 21 to 25 formed in an interlayer insulating film (not shown) covering the wiring lines 11 to 15.

Edges 11a to 15a of the five wiring lines 11 to 15 are arranged to be sequentially shifted by ⅕ the minimum line width in the extending direction of the wiring lines 11 to 15. The five openings 21 to 25 are arranged on the edges 11a to 15a side of the wiring lines 11 to 15 in a direction perpendicular to the extending direction of the wiring lines 11 to 15.

FIG. 1 shows a state wherein an alignment error with respect to the wiring lines 11 to 15 does not occur in the openings 21 to 25. In the state of FIG. 1, although the wiring lines 11 to 13 and the openings 21 to 23 are not respectively in contact with each other, the wiring lines 14 to 15 and the openings 24 and 25 are respectively in contact with each other. These contact states can be confirmed by providing the wiring lines 11 to 15 and the openings 21 to 25 with five sets of measurement terminals, applying a voltage across the measurement terminals of the respective sets, and measuring electric resistance across these measurement terminals.

FIG. 2 shows a state wherein an alignment error with respect to the wiring lines 11 to 15 has occurred in the openings 21 to 25 in the extending direction of the wiring lines 11 to 15. When an alignment error has occurred in such a direction that the openings 21 to 25 become near the wiring lines 11 to 15, when compared to the states of FIG. 1, the opening 23 is newly in contact with the wiring line 13. When an alignment error has occurred in such a direction that the openings 21 to 25 separate from the wiring lines 11 to 15, when compared to the states of FIG. 1, the opening 24 newly separates from the wiring line 14.

Therefore, in the states of FIG. 2, even when an alignment error has occurred either in such a direction that the openings 21 to 25 become near the wiring lines 11 to 15 or in such a direction that the openings 21 to 25 separate from the wiring lines 11 to 15, confirmation of these contact states shows that such an alignment error is about ⅕ the minimum line width.

Figure 3:
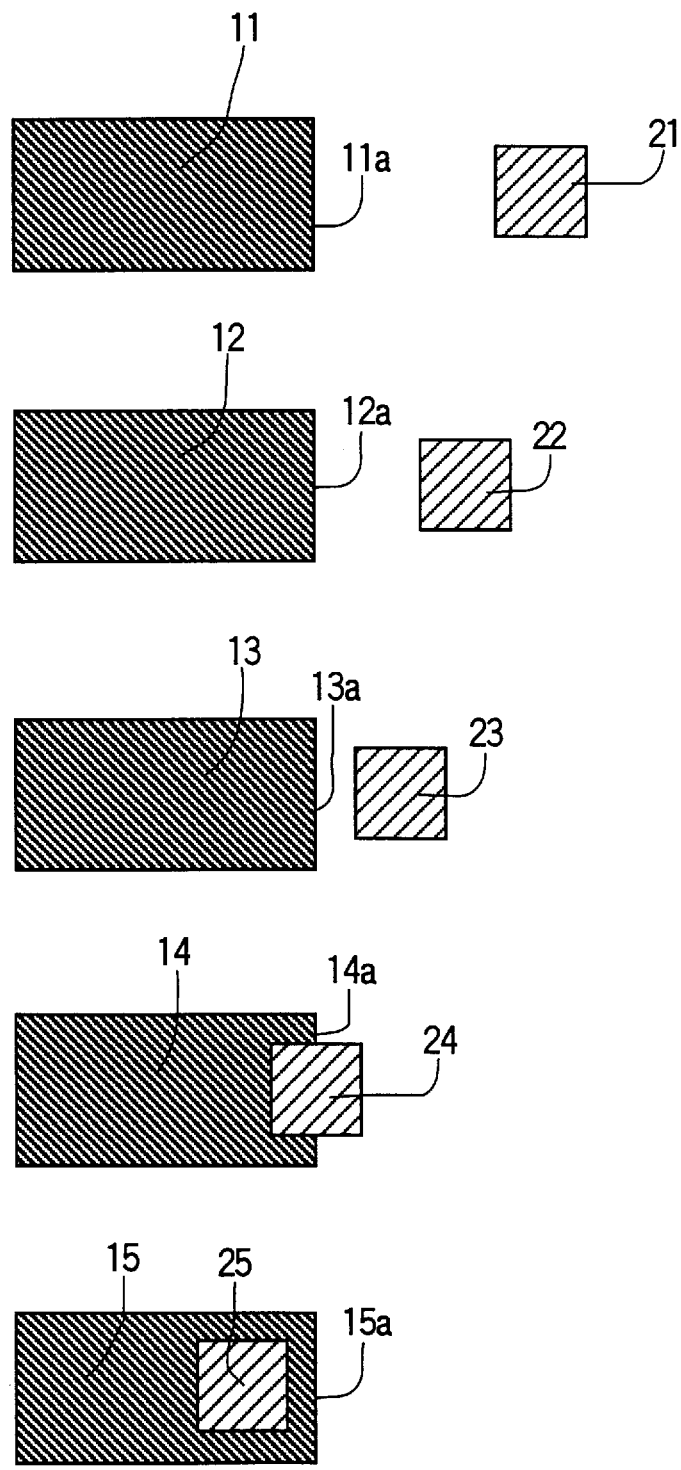
FIG. 3 is a plan view of an alignment error measurement pattern according to the second embodiment of the present invention, in which an alignment error does not occur.
Figure 4:
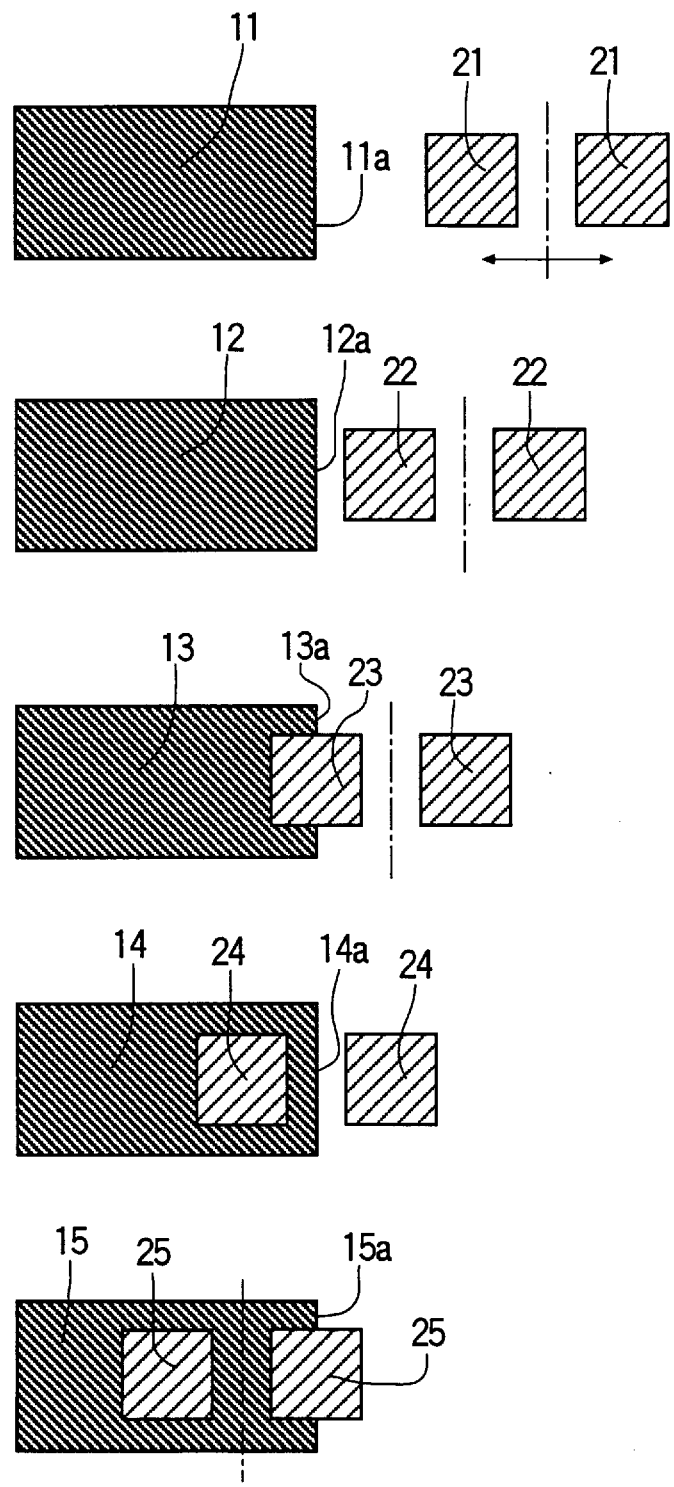
FIG. 4 is a plan view of an alignment error measurement pattern according to the second embodiment of the present invention, in which an alignment error has occurred.

FIGS. 3 and 4 show the second embodiment. In the second embodiment, edges 11a to 15a of wiring lines 11 to 15 are arranged in a direction perpendicular to the extending direction of the wiring lines 11 to 15, and openings 21 to 25 are arranged to be sequentially shifted by ⅕ the minimum line width in the extending direction of the wiring lines 11 to 15. Excluding these respects, the second embodiment as well has substantially the same arrangement as that of the first embodiment shown in FIGS. 1 and 2. The second embodiment can also achieve the same operation and effect as the first embodiment.

Figure 5:
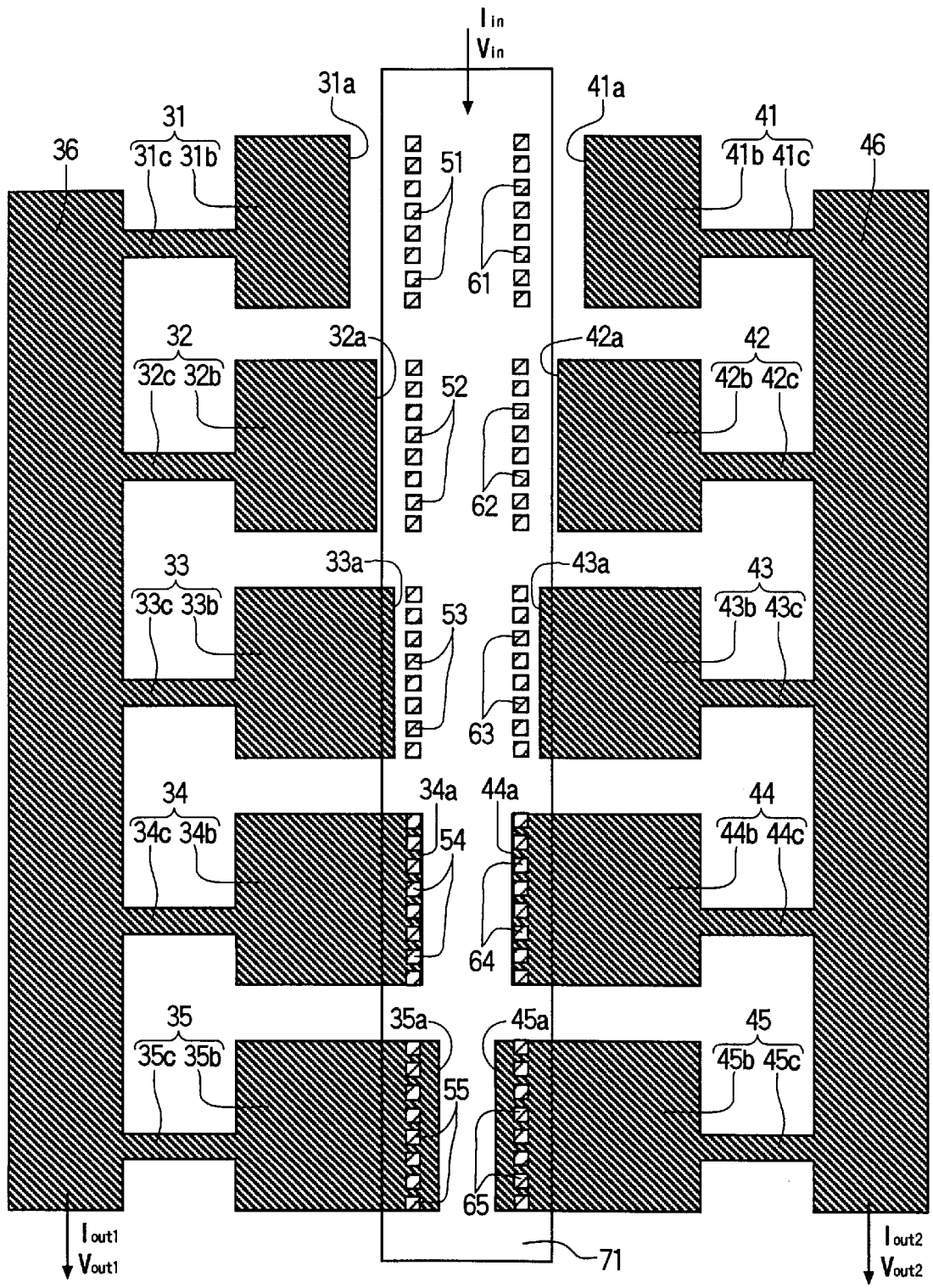
FIG. 5 is a plan view of an alignment error measurement pattern according to the third embodiment of the present invention, in which an alignment error does not occur.

FIG. 5 shows the third embodiment. In the alignment error measurement pattern of the third embodiment, five wiring lines 31 to 35 respectively have wide low-resistance portions 31b to 35b and narrow high-resistance portions 31c to 35c. Edges 31a to 35a of the wiring lines 31 to 35 are arranged to be sequentially shifted by $\Delta X$ in the extending direction of the wiring lines 31 to 35.

Although the high-resistance portions 31c to 35c are made of the same material as that of the low-resistance portions 31b to 35b, since they are long and narrow, they have a sufficiently high electric resistance. The electric resistances of the high-resistance portions 31c to 35c substantially determine the electric resistances of the wiring lines 31 to 35. For example, assuming that the sheet resistance of the material of the wiring lines 31 to 35 is 10 $\Omega/\square$, with a length=100 $\mu$m and a width=1 $\mu$m, the respective high-resistance portions 31c to 35c have an electric resistance of 1 k$\Omega$.

The wiring lines 31 to 35 are connected in parallel to each other with one current extraction wiring line 36, and five sets of openings 51 to 55 are arranged on the edges 31a to 35a side of the wiring lines 31 to 35 in a direction perpendicular to the extending direction of the wiring lines 31 to 35. Regarding the number of openings 51, 52, 53, 54 or 55, it is set to 10 or more if possible so that even if the contact resistance between the measurement terminals arranged in these openings 51 to 55 and the wiring lines 31 to 35 increases, the electric resistances of the high-resistance portions 31c to 35c substantially determine the electric resistance of the wiring lines 31 to 35.

Wiring lines 41 to 46 and openings 61 to 65 are arranged to be axi-symmetric with the wiring lines 31 to 36 and the openings 51 to 55 in the extending direction of the wiring lines 31 to 35, and the openings 51 to 55 and the openings 61 to 65 are connected in parallel to each other with one current supply wiring line 71. In the third embodiment having the above arrangement, although the wiring lines 31 to 33 and the wiring lines 41 to 43 are not respectively in contact with the wiring lines 51 to 53, and the wiring lines 61 to 63, the wiring lines 34 and 35 and the wiring lines 44 and 45 are respectively in contact with the openings 54 and 55 and the openings 64 and 65.

Therefore, if a current is supplied from the wiring line 71 to the wiring line 36 or to the wiring line 46, the electric resistance determined by a current $I_{out1}$ or $I_{out2}$ and a potential difference $V_{in}-V_{out1}$ or $V_{in}-V_{out2}$ becomes 500 $\Omega$, which is the parallel resistance of the high-resistance portions 34c and 35c or the high-resistance portions 44c and 45c. Therefore, it is apparent that the wiring line 34 and 35 and the wiring lines 44 and 45 are respectively in contact with the openings 54 and 55 and the openings 64 and 65.

The low-resistance portions 31b to 35b and the low-resistance portions 41b to 45b have different lengths and the wiring lines 36 and 46 have electric resistances. Assuming that the electric resistance of any of the high-resistance portions 31c to 35c and the high-resistance portions 41c to 45c is 1$\Omega$k, for example, the parallel resistance of the high-resistance portion 34c and 35c or the high-resistance portions 44c and 45c is not precisely 500 $\Omega$.

In this case, if the electric resistances of the wiring lines 31 to 35 and 41 to 45 including the wiring lines 36 and 46 are set equal to each other by, e.g., sequentially changing the electric resistances of the high-resistance portions 31c to 35c and the high-resistance portions 41c to 45c, the contact states, i.e., the alignment errors, between the wiring lines 31 to 35 and 41 to 45, and the openings 51 to 55 and 61 to 65 can be measured accurately.

Figure 6:
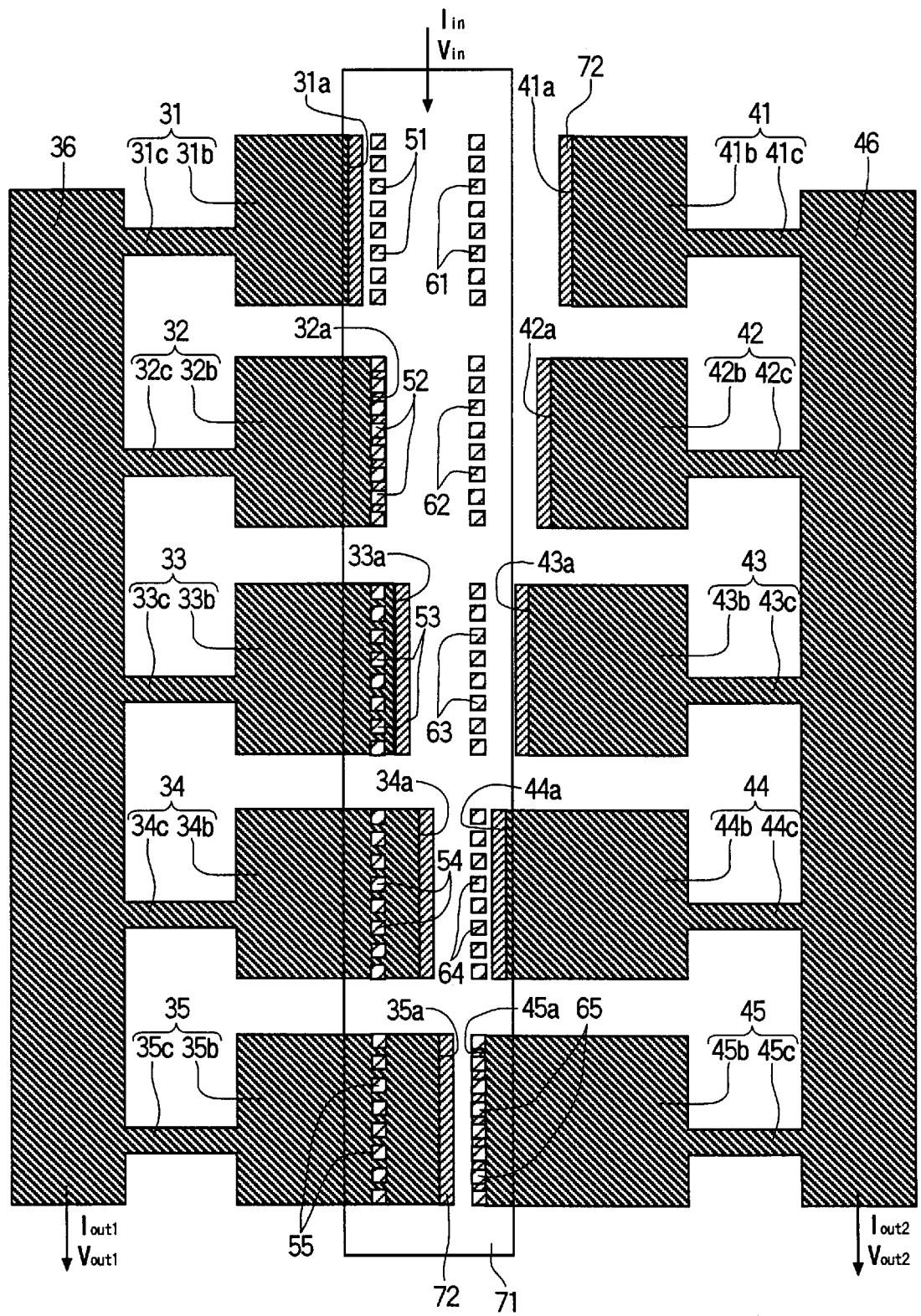
FIG. 6 is a plan view of an alignment error measurement pattern according to the fourth embodiment of the present invention, in which an alignment error has occurred.

FIG. 6 shows the fourth embodiment. In the third embodiment shown in FIG. 5, the widths of wiring lines 31 to 36 and 41 to 46, and the diameters of openings 51 to 55 and 61 to 65 do not deviate from the designed values, and alignment errors with respect to the wiring lines 31 to 35 and 41 to 45 do not occur in the openings 51 to 55 and 61 to 65. In the fourth embodiment, variations of the widths of wiring lines 31 to 36 and 41 to 46, and alignment errors with respect to the wiring lines 31 to 35 and 41 to 45 of openings 51 to 55 and 61 to 65 occur simultaneously.

Deviations in the widths of wiring lines 31 to 36 and 41 to 46 and the diameters of openings 51 to 55 and 61 to 65 from the designed values occur in the entire portions of the wiring lines 31 to 36 and 41 to 46 and the openings 51 to 55 and 61 to 65 due to taper etching during patterning or the like. In the fourth embodiment, since alignment errors in the extending direction of the wiring lines 31 to 35, and 41 to 45 are measured, deviations 72 are shown only in edges 31a to 35a and 41a to 45a of the wiring lines 31 to 35 and 41 to 45, respectively.

In the fourth embodiment, the measurement results of $I_{in}$, $V_{in}$, $I_{out1}$, $V_{out1}$, $I_{out2}$, and $V_{out2}$ show that the wiring lines 32 to 35 and 45 are respectively in contact with the openings 52 to 55 and 65.

As shown in FIG. 5, if an alignment error does not occur, of the openings 51 to 55, only the openings 54 and 55 are in contact with the corresponding ones of the wiring lines 31 to 35. Therefore, in the fourth embodiment, the openings 52 and 53 are newly in contact with the wiring lines 32 and 33. Accordingly, the openings 51 to 55 are apparently shifted toward the wiring lines 31 to 35 by about 2$\Delta X$.

As shown in FIG. 5, if an alignment error does not occur, of the openings 61 to 65, only the openings 64 and 65 are in contact with the corresponding ones of the wiring lines 41 to 45. Therefore, in the fourth embodiment, the opening 64 newly separates from the wiring line 44. Accordingly, the openings 61 to 65 are apparently shifted toward the wiring lines 31 to 35 by about $\Delta X$.

An alignment error in the openings 51 to 55 and that of the openings 61 to 65 are different from each other in this manner because the deviations 72 are added to the widths of wiring lines 31 to 35 and 41 to 45. Accordingly, the intermediate value between the alignment error of the openings 51 to 55 and the alignment error of the openings 61 to 65 is employed, and the actual alignment error between the openings 51 to 55 and 61 to 65 and the wiring lines 31 to 35 and 41 to 45 is about 1.5ΔX toward the wiring lines 31 to 35.

In the fourth embodiment described above, only the widths of wiring lines 31 to 36 and 41 and 46 deviate, and the diameters of openings 51 to 55 and 61 to 65 do not deviate. The alignment errors can be obtained from the contact states between the openings 51 to 55 and 61 to 65 and the wiring lines 31 to 35 and 41 to 45. Thus, even if the diameters of openings 51 to 55 and 61 to 65 deviate or both the widths of wiring lines 31 to 36 and 41 to 46 and the diameters of openings 51 to 55 and 61 to 65 deviate, the alignment error can be obtained in the same manner as in the fourth embodiment.

Figure 7:
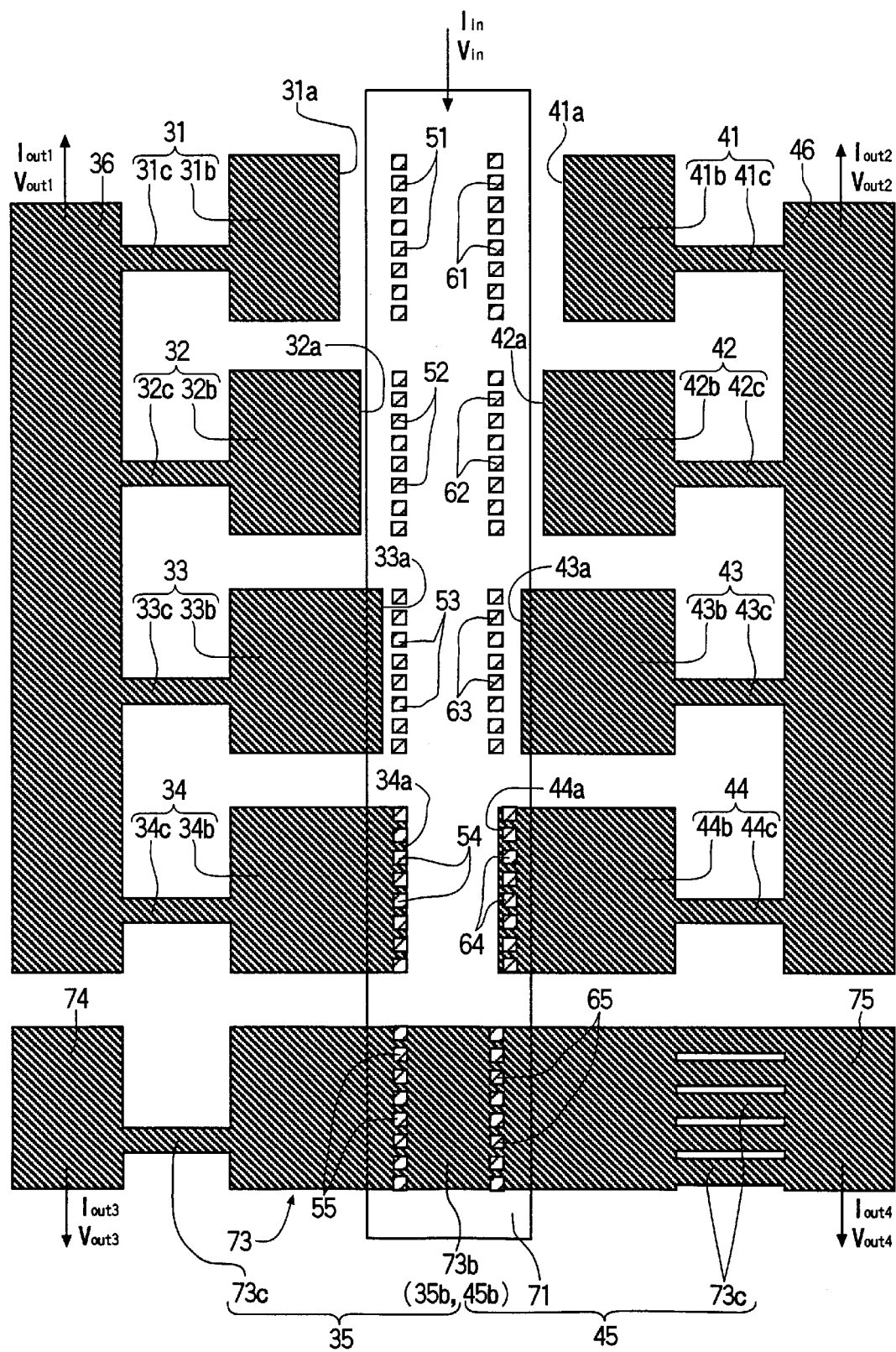
FIG. 7 is a plan view of an alignment error measurement pattern according to the fifth embodiment of the present invention, in which an alignment error does not occur.

FIG. 7 shows the fifth embodiment. In the alignment error measurement pattern of the fifth embodiment, a wiring line 73 having a low-resistance portion 73b and high-resistance portions 73c is formed in place of the wiring lines 35 and 45. The low-resistance portion 73b corresponds to the low-resistance portions 35b and 45b of the wiring lines 35 and 45 in continuation. One high-resistance portion 73c is connected to one side of the low-resistance portion 73b, and five high-resistance portions 73c are connected to the other side of the low-resistance portion 73b.

Current extraction wiring lines 74 and 75 are connected to the high-resistance portion 73c on one side of the low-resistance portion 73b and to the high-resistance portions 73c on the other side of the low-resistance portion 73b, respectively. Excluding these respects, the alignment error measurement pattern of the fifth embodiment has substantially the same arrangement as that of the third embodiment shown in FIG. 5.

In this fifth embodiment, even if the maximum alignment error occurs, since the low-resistance portion 73b of the wiring line 73 and the openings 55 and 65 are reliably in contact with each other, the electric resistance of the high-resistance portions 73c can be obtained in advance by supplying a current from the wiring line 71 to the wiring line 74 or 75. For this reason, the alignment error can be obtained easily from the electric resistance obtained by supplying a current from the wiring line 71 to the wiring line 36 or 46.

In the third to fifth embodiments described above, the positions of the edges 31a to 35a and 41a to 45a of the wiring lines 31 to 35 and 41 to 45 are sequentially shifted in the same manner as in the first embodiment. However, the positions of the openings 51 to 55 and 61 to 65 may be sequentially shifted, as in the second embodiment.

If the shift amount is about ⅕ or less the minimum line width, the alignment error can be measured at appropriate precision that does not hinder the operation of the semiconductor device. Therefore, the above shift amount, the number of wiring lines and the number of openings can be appropriately selected within ranges with which the sum of shift amounts is sufficient for measurement of the alignment error.

In the third to fifth embodiments, each of the openings 51 to 55 and 61 to 65 has a plurality of small openings close to squares. However, each of the openings 51 to 55 and 61 to 65 may have a single rectangular opening. In any of the first to fifth embodiments described above, an alignment error in the horizontal direction of the drawings is measured. However, if the alignment error measurement pattern is rotated through 90°, even an alignment error in the vertical direction of the drawings can also be measured.

What is claimed is:

1. An alignment error measurement pattern characterized by comprising a plurality of wiring patterns formed on a substrate, an insulating film covering said wiring patterns, and a plurality of opening patterns formed in said insulating film, wherein edges of said wiring patterns and said opening patterns correspond to each other to constitute sets, and distances between said edges of said wiring patterns and said opening patterns in said sets are all different from one set to another.

2. An alignment error measurement pattern according to claim 1, characterized in that said wiring patterns are formed to be parallel to each other.

3. An alignment error measurement pattern according to claim 2, characterized in that said wiring patterns are formed in two lines such that edges thereof oppose each other, and said opening patterns are formed in a line along a direction of lines of said wiring patterns.

4. An alignment error measurement pattern according to claim 1, characterized in that distances between said edges of said wiring patterns and said opening patterns sequentially differ in the same direction.

5. An alignment error measurement pattern according to claim 1, characterized in that said wiring patterns respectively comprise low-resistance portions having said edges and relatively low electric resistances, and high-resistance portions communicating with said low-resistance portions, having relatively high electric resistances, and determining electric resistances of wiring lines.

6. An alignment error measurement pattern according to claim 1, characterized in that a plurality of openings are formed for each of said plurality of wiring patterns.

7. An alignment error measurement pattern according to claim 1, characterized by comprising said wiring patterns in which, even when the maximum alignment error occurs, said opening patterns come into contact with said low-resistance portions.

8. An alignment error measurement pattern according to claim 1, characterized in that electric resistances of said plurality of wiring patterns are equal to each other.

9. An alignment error measurement pattern according to claim 1, characterized in that said wiring lines are connected to each other by connecting edges thereof that are opposite to said edges near said opening patterns to be electrically parallel with each other, and a wiring layer is formed on said insulating film to cover all of said plurality of opening patterns.

10. An alignment error measurement pattern according to claim 1, characterized in that corresponding ones of said plurality of wiring patterns and said opening patterns constituting pairs in said plurality of sets are arranged to be axi-symmetric to each other in the same direction.

11. An alignment error measurement pattern according to claim 1, characterized in that said distances between said wiring patterns and opening patterns in said respective sets differ from one set to another by ⅕ a minimum line width.

* * * * *